(12) United States Patent
Stanton et al.

(10) Patent No.: US 6,818,910 B2
(45) Date of Patent: Nov. 16, 2004

(54) WRITING METHODOLOGY TO REDUCE WRITE TIME, AND SYSTEM FOR PERFORMING SAME

(75) Inventors: William A. Stanton, Boise, ID (US); Eugene A DeLaRosa, Boise, ID (US)

(73) Assignee: Micron Technology, Inc., Boise, ID (US)

(*) Notice: Subject to any disclaimer, the term of this patent is extended or adjusted under 35 U.S.C. 154(b) by 147 days.

(21) Appl. No.: 10/226,414

(22) Filed: Aug. 23, 2002

(65) Prior Publication Data

US 2004/0036040 A1 Feb. 26, 2004

(51) Int. Cl.[7] ............................. G21K 5/10; G21K 5/08
(52) U.S. Cl. ........................... 250/492.22; 250/492.1; 250/492.2; 250/492.3
(58) Field of Search .......................... 250/492.1, 492.2, 250/492.22, 492.3; 430/5, 22, 321, 322; 359/569; 385/131

(56) References Cited

U.S. PATENT DOCUMENTS

| | | | |
|---|---|---|---|
| 5,523,580 A | 6/1996 | Davis ........................ | 250/505.1 |
| 5,589,305 A | 12/1996 | Tomofuji et al. .............. | 430/5 |
| 5,667,918 A | 9/1997 | Brainerd et al. ................ | 430/5 |
| 5,699,185 A * | 12/1997 | MacDonald et al. ......... | 359/569 |
| 5,849,440 A | 12/1998 | Lucas et al. ..................... | 430/5 |
| 5,981,962 A | 11/1999 | Groves et al. .......... | 250/492.23 |
| 6,175,122 B1 | 1/2001 | Groves et al. .......... | 250/492.23 |
| 6,280,646 B1 | 8/2001 | Stocks et al. .................. | 216/41 |
| 6,376,130 B1 | 4/2002 | Stanton .......................... | 430/5 |
| 6,381,300 B1 | 4/2002 | Ezaki ........................... | 378/35 |
| 6,428,940 B1 * | 8/2002 | Sandstrom .................... | 430/22 |
| 6,517,997 B1 * | 2/2003 | Roberts ....................... | 430/322 |
| 6,639,232 B1 * | 10/2003 | Tange ..................... | 250/492.22 |
| 2001/0031122 A1 * | 10/2001 | Lackritz et al. ............. | 385/131 |
| 2002/0012853 A1 | 1/2002 | Suganuma et al. ............ | 430/5 |
| 2002/0071998 A1 | 6/2002 | DeLaRosa ...................... | 430/5 |
| 2002/0086222 A1 * | 7/2002 | Migitaka et al. ............... | 430/5 |
| 2002/0086225 A1 * | 7/2002 | Huang et al. .................. | 430/5 |
| 2002/0086245 A1 * | 7/2002 | Zait et al. ................... | 430/321 |

* cited by examiner

*Primary Examiner*—John R. Lee
*Assistant Examiner*—Mary El-Shammaa
(74) *Attorney, Agent, or Firm*—Williams, Morgan & Amerson, P.C.

(57) ABSTRACT

The present invention is generally directed to various reticle writing methodologies to reduce write time, and a system for performing same. In one illustrative embodiment, the method comprises exposing a layer of photoresist in accordance with a first writing pattern in a first area of the layer of photoresist and exposing the layer of photoresist in accordance with a second writing pattern in a second area of the layer of photoresist, the first and second areas of the layer of photoresist overlapping one another in at least one region. In another illustrative embodiment, the method comprises creating a collection of digital data corresponding to a desired pattern for a reticle and separating the collection of digital data into at least two separate groups of data, a first of the data groups being used to define a first writing pattern for the reticle, a second of the data groups being used to define a second writing pattern for the reticle, wherein the first and second writing patterns overlap one another in at least one region. In yet another illustrative embodiment, the method comprises forming a layer of photoresist above at least one of a semiconducting substrate and a process layer, exposing the layer of photoresist in accordance with a first writing pattern in a first area of the layer of photoresist, and exposing the layer of photoresist in accordance with a second writing pattern in a second area of the layer of photoresist, wherein the first and second areas overlap one another in at least one region.

90 Claims, 5 Drawing Sheets

WRITING METHODOLOGY TO REDUCE WRITE TIME, AND SYSTEM FOR PERFORMING SAME

BACKGROUND OF THE INVENTION

1. Field of the Invention

The present invention generally relates to the field of photolithography, and, more particularly, to a writing methodology to reduce write time, and a system for performing same.

2. Description of the Related Art

Manufacturing modern integrated circuit devices requires the performance of many complex processes, such as deposition processes, etching processes, ion implant processes and photolithography processes. In general, photolithography involves the formation of a patterned layer of photoresist above a previously formed process layer. Ultimately, the underlying process layer will be subjected to one or more etching processes while using the patterned layer of photoresist as a mask. This will result in the selective removal of the portions of the process layer that are not protected by the photoresist masking layer. That is, a plurality of features, e.g., gate electrode structures, metal contacts, etc., will be formed in the underlying process layer. The patterned layer of photoresist is then removed and additional process operations are performed, e.g., additional layers of material are formed and selectively etched, until such time as the integrated circuit device is completed.

Photolithography is one of the most important, expensive and time-consuming processes performed in a modern integrated circuit manufacturing facility. In the photolithography process, a layer of photoresist material (positive or negative) is deposited on a process layer that has been formed above a semiconducting substrate, i.e., a wafer. There-after, the layer of photoresist is selectively exposed to a light source. More particularly, during the exposure process, radiant energy, such as ultraviolet light or deep ultraviolet light, is directed through a reticle to selectively expose the layer of photoresist. In this manner, the pattern in the reticle is transferred to the layer of photoresist. The layer of photoresist is then developed to remove the exposed portions of the layer of photoresist (for a positive resist material) to thereby define a patterned photoresist mask that is used in the subsequent etching of the underlying process layer. For negative photoresist materials, the unexposed portions of the layer of photoresist are removed during the development process. Additionally, the layer of photoresist is exposed to the light source on a flash-by-flash basis in a stepper exposure tool. The number of production die in each flash pattern may vary, e.g., a 2×2 pattern (4 die), a 2×4 pattern (8 die), etc. This step-by-step exposure process is continued until all of the areas of the production die on the wafer are exposed.

The manufacture and patterning of a reticle is a very time-consuming and expensive process. A reticle for use in manufacturing a modern integrated circuit product may cost between $25,000–$75,000, depending upon the type of reticle and the complexity of the reticle pattern. A reticle typically includes a transparent substrate comprised of, for example, quartz or glass. A very thin, opaque film is formed above the transparent substrate. The opaque film may be comprised of a variety of materials, such as chromium. To form the pattern in the reticle, a layer of photoresist material, e.g., a positive photoresist material, is formed above the opaque film, and an electron beam is used to expose selected portions of the layer of photoresist. Thereafter, the exposed portions of the layer of positive photoresist are removed, thereby exposing portions of the underlying opaque film, e.g., chromium. An etching process is then performed using the patterned layer of photoresist as a mask to remove the exposed portions of the opaque film, resulting in the desired pattern in the opaque film. The patterned layer of photoresist is then removed, and the reticle is ready for use in the photolithography process as described above.

Reticles are typically manufactured using high energy, approximately 50 keV, tools that employ a variable shaped beam, e.g., an electron beam tool, such as the Model No. EBM 3000 manufactured by Toshiba Machine. FIG. 1 is an enlarged plan view of a layout of a portion of a reticle 10. A pattern comprised of a plurality of illustrative features 12 that are to be formed in the opaque layer of the reticle 10 are shown in the layout. Typically, a semiconductor manufacturer will provide the desired pattern for the reticle 10 to a vendor that manufactures reticles in a binary digital format (Mebes). In turn, to develop a write pattern for an illustrative e-beam tool, the reticle manufacturer then fragments or divides the digital data representative of the overall desired reticle pattern into a plurality of non-overlapping, geometric shapes, e.g., rectangles, that correspond to the overall desired reticle pattern.

FIG. 2 is an illustrative example of one possible writing pattern for the reticle pattern shown in FIG. 1. As indicated therein, each feature 12 is fractured or sub-divided into four segments numbered 1–4 with no overlap between the rectangular segments. The specific process by which the reticle pattern data is fragmented may vary depending upon the reticle writing equipment employed and the reticle supplier. In some cases, the manner in which the fragmentation of the reticle pattern data is accomplished is proprietary to each particular reticle vendor. Once the reticle pattern data is fragmented, it is provided to the electron beam tool to write or expose the desired portions of the layer of photoresist that correspond to the fragmented segments 1–4 for each feature 12.

Depending upon the complexity of the desired reticle pattern, and the fragmenting process, the above-described technique can lead to very long reticle write times, e.g., greater than 12 hours for some complex reticle designs. Such a long lead time can be very problematic in the fast-paced environment of semiconductor manufacturing. For example, the designs of integrated circuit products and the processes used to make such products are under constant review in an effort to improve product performance, reduce manufacturing cost and increase the overall production yield of the manufacturing process. As a result, new reticles are frequently requested in attempts to upgrade or improve product design and/or manufacturing yields. However, given the relatively long writing times employed with existing techniques, quick turnaround of new reticle designs is very difficult. As a result, implementing product changes takes longer than would otherwise be desired. Moreover, existing techniques for producing reticles are very expensive due, in part, to the duration of the writing time for the reticle pattern.

Additionally, as device dimensions continue to decrease, the existing deep ultraviolet photolithography equipment may not be able to reliably pattern a layer of photoresist to the desired dimensions. As a result, the creation of faster and more powerful integrated circuit devices may be constrained due to the limits of deep ultraviolet photolithography tools and techniques.

The present invention is directed to various methods and systems that may solve, or at least reduce, some or all of the aforementioned problems.

SUMMARY OF THE INVENTION

The present invention is generally directed to various writing methodologies to reduce write time, and a system for performing same. The present invention may be employed in the context of exposing a layer of photoresist during the course of manufacturing a reticle and/or exposing a layer of photoresist during the course of forming various features on production integrated circuit devices. In one illustrative embodiment, the method comprises exposing a layer of photoresist in accordance with a first writing pattern in a first area of the layer of photoresist and exposing the layer of photoresist in accordance with a second writing pattern in a second area of the layer of photoresist, wherein the first and second areas of the layer of photoresist overlap one another in at least one region. In other embodiments, the method further comprises creating the first and second writing patterns by separating digital data corresponding to a desired pattern for a reticle into at least two separate groups of data, a first of the data groups being used to define the first writing pattern and a second of the data groups being used to define the second writing pattern.

In another illustrative embodiment, the method comprises creating a collection of digital data corresponding to a desired pattern for a reticle and separating the collection of digital data into at least two separate groups of data, a first of the data groups being used to define a first writing pattern for the reticle, a second of the data groups being used to define a second writing pattern for the reticle, wherein the first and second writing patterns overlap one another in at least one region. In even further embodiments, the method further comprises separating the collection of digital data into at least three separate groups of data, a third of the data groups being used to define a third writing pattern for the reticle, wherein the third reticle writing pattern overlaps at least one of the first and second writing patterns in at least one region.

In a further illustrative embodiment, the method comprises forming a layer of photoresist above at least one of a semiconducting substrate and a process layer, exposing the layer of photoresist in accordance with a first writing pattern in a first area of the layer of photoresist, exposing the layer of photoresist in accordance with a second writing pattern in a second area of the layer of photoresist, wherein the first and second areas of the layer of photoresist overlap one another in at least one area, and removing exposed portions of the layer of photoresist in the first and second areas.

In another illustrative embodiment, the method comprises forming a layer of photoresist above at least one of a semiconducting substrate and a process layer, creating a collection of digital data corresponding to a desired pattern for the layer of photoresist, and separating the collection of digital data into at least two separate groups of data, a first of said data groups being used to define a first writing pattern for the layer of photoresist, a second of the data groups being used to define a second writing pattern for the layer of photoresist, wherein the first and second writing patterns overlap one another in at least one region.

In yet another illustrative embodiment, there is provided an exposure system that comprises an electron beam source and a controller that is adapted to direct electrons emitted by the electron beam source so as to expose a layer of photoresist in accordance with a first writing pattern in a first area of a layer of photoresist and expose the layer of photoresist in accordance with a second writing pattern in a second area of the layer of photoresist, the first and second areas of the layer of photoresist overlapping one another in at least one region.

BRIEF DESCRIPTION OF THE DRAWINGS

The invention may be understood by reference to the following description taken in conjunction with the accompanying drawings, in which like reference numerals identify like elements, and in which.

Figure 1:
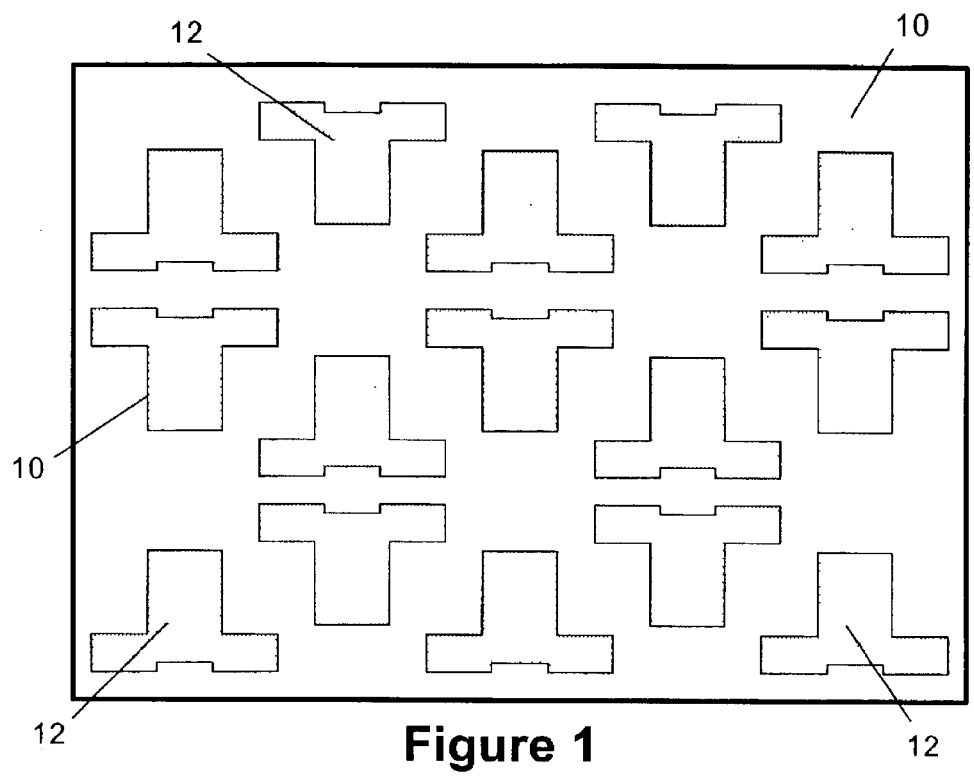
FIG. 1 is a plan view of an illustrative pattern for a reticle.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 3:
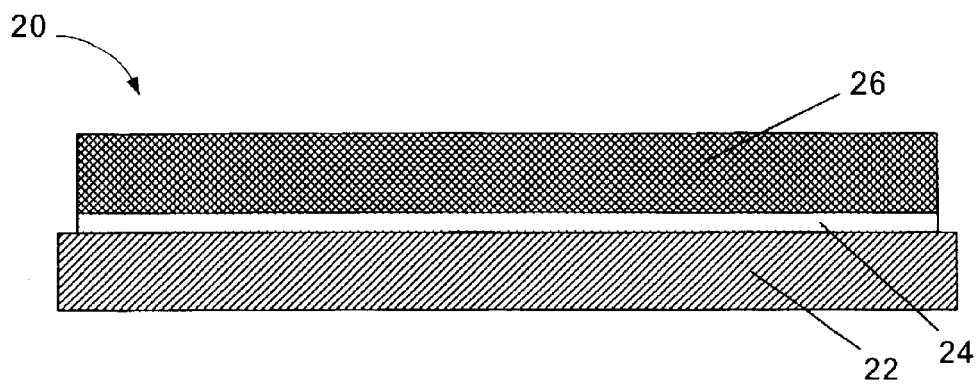
FIG. 3 is a cross-sectional view of an illustrative reticle that may be formed in accordance with the inventive methods described herein.

FIG. 3 is a cross-sectional view of an illustrative reticle 20 that may be manufactured and used in accordance with various embodiments of the present invention. The reticle 20 is comprised of a substrate 22 and an opaque layer 24. A layer of photoresist 26 is positioned above the opaque layer 24. The substrate 22 may be comprised of a variety of transparent materials, such as glass or quartz. The substrate 22 may have a thickness that ranges from 0.09–0.25 inches. The opaque layer 24 may also be comprised of a variety of materials, such as a metal, e.g., chromium or a chromium alloy. The opaque layer 24 may have a thickness that ranges from approximately 50–150 nm. The layer of photoresist 26 may be a positive or negative resist, and it may be formed above the opaque layer 24 by a variety of known techniques.

As will be understood by those skilled in the art after a complete reading of the present application, the present invention is not limited in its use to any particular type of reticle or the materials used to manufacture the reticle. Moreover, the present invention may be employed when using positive or negative photoresist materials, and in defining patterns in the opaque layer 24 of any size, shape or configuration. Thus, the present invention should not be considered as limited to the materials of construction of the reticle 20 or the pattern formed in the reticle 20 unless such limitations are expressly recited in the appended claims.

Figure 4:
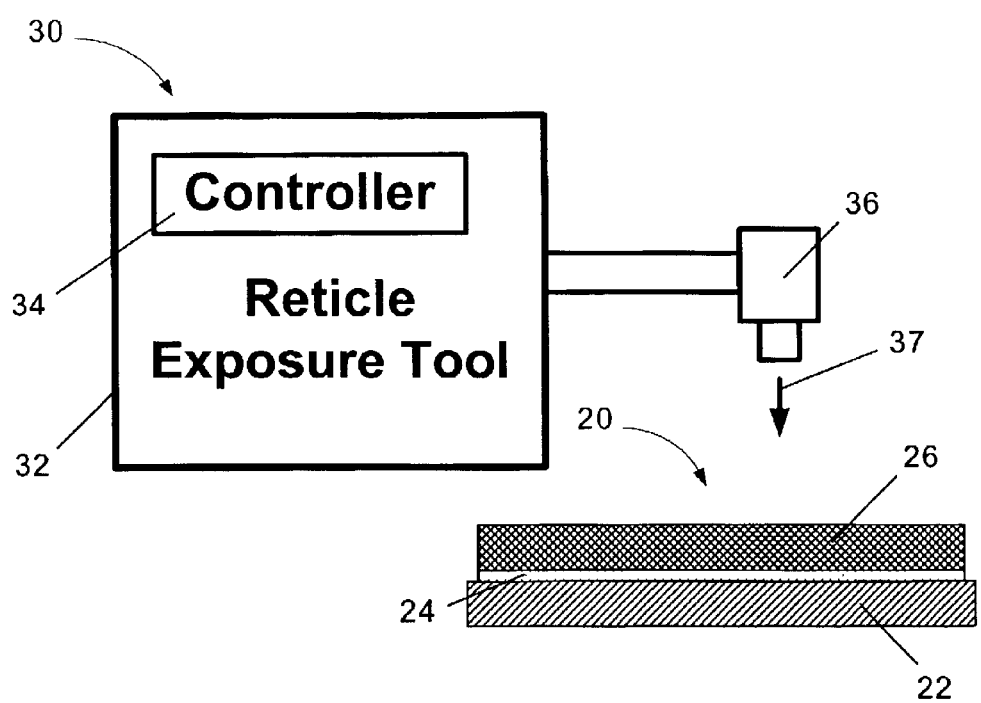
FIG. 4 is a schematic view of an illustrative reticle writing system in accordance with one illustrative embodiment of the present invention.

FIG. 4 is a schematic view of an illustrative reticle exposure tool 30 that may be used to expose selective portions of the layer of photoresist 26 above the reticle 20. As shown in FIG. 4, the reticle exposure tool 30 is comprised of a housing 32, a controller 34 and an electron beam source 36. Many features of the reticle exposure tool 30 are not depicted in FIG. 4 so as not to obscure the present invention. For example, an actual reticle exposure tool 30 would include, among other things, a power supply, various optical lenses, means for securing the reticle 20 in place during the writing process, etc. The reticle exposure tool 30 is intended to be illustrative in nature in that it may represent any of a variety of tools used to produce reticles. For example, in one illustrative embodiment, the reticle exposure tool 10 is an EBM 3000 electron beam tool with a variable shaped electron beam sold by Toshiba Machine. Of course, as will be apparent to those skilled in the art after a complete reading of the present application, the present invention may be employed with a variety of different types of reticle writing tools, such as those manufactured by Joel, Hitachi and Etec.

In general, the electron beam source 36, such as an electron beam gun, will be used to direct a stream of electrons, as indicated by the arrow 37, to the desired areas of the layer of photoresist 26 in a predetermined writing pattern. The controller 34 controls the writing pattern of the electron beam source 36 and the energy level used in the reticle writing process. For modern reticle writing tools, this energy level may be approximately 50 keV.

Figure 2:
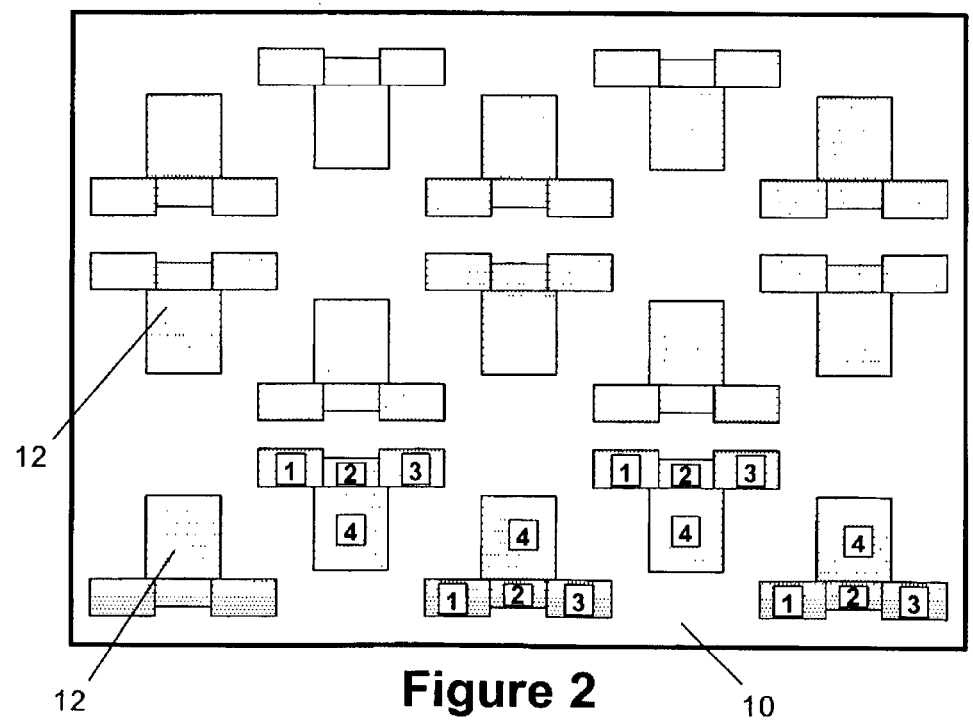
FIG. 2 is a plan view of the illustrative reticle writing plan for the reticle pattern shown in FIG. 1 after data corresponding to the desired reticle pattern has been fragmented in accordance with prior art techniques.
Figure 5:
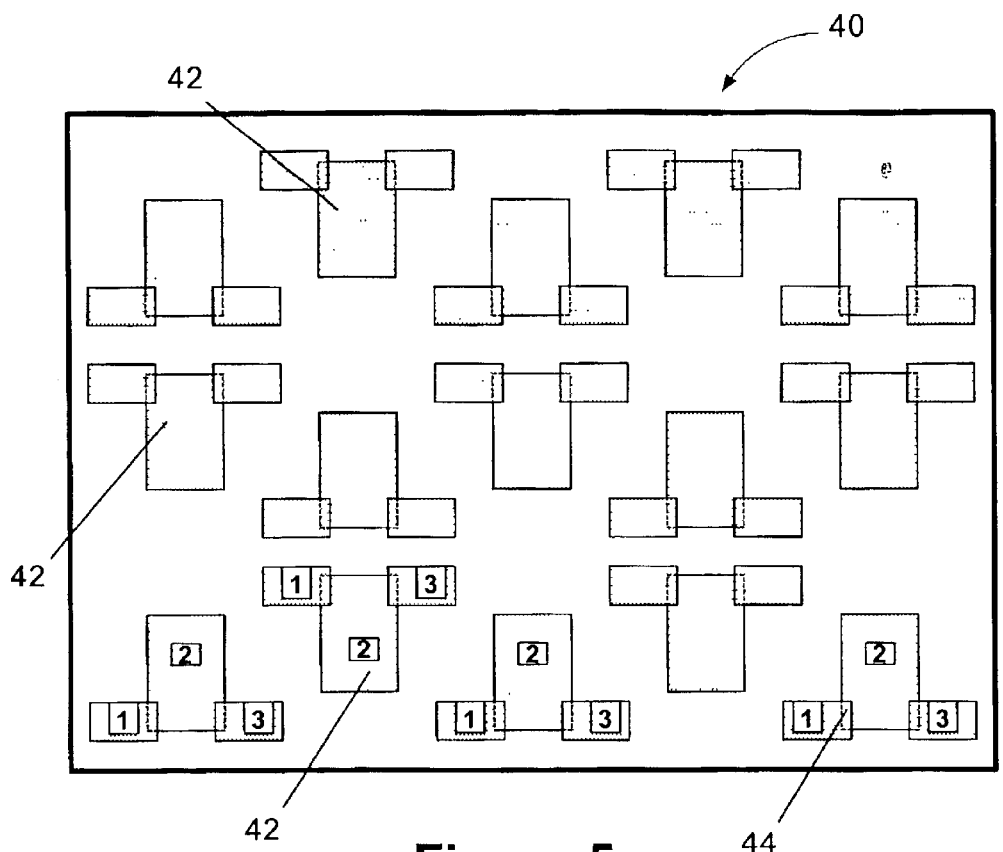
FIG. 5 is a plan view of an illustrative reticle writing pattern fragmented in accordance with one illustrative embodiment of the present invention.

FIG. 5 is a plan view of a reticle 40 with a plurality of features 42 formed in the reticle 30 in accordance with one illustrative embodiment of the present invention. FIG. 5 may be compared with FIG. 2 for purposes of explaining the writing strategy of the present invention. In general, as shown in FIG. 5, the data corresponding to the feature 42 is fragmented into three segments 1–3 as compared to the four segments 1–4 for the features 10 generated in accordance with a prior art reticle writing method as depicted in FIG. 2. Moreover, in contrast to prior art methodologies, the reticle writing strategy of the present invention allows the segments 1–3 to overlap in the areas 44 indicated in FIGS. 5 and 6. In the depicted embodiment, the overlap regions 44 have a width dimension 44W and a length dimension 44L as indicated in the drawings. Of course, the overlap regions 44 need not be rectangular or symmetrical for every reticle writing strategy.

Figure 6:
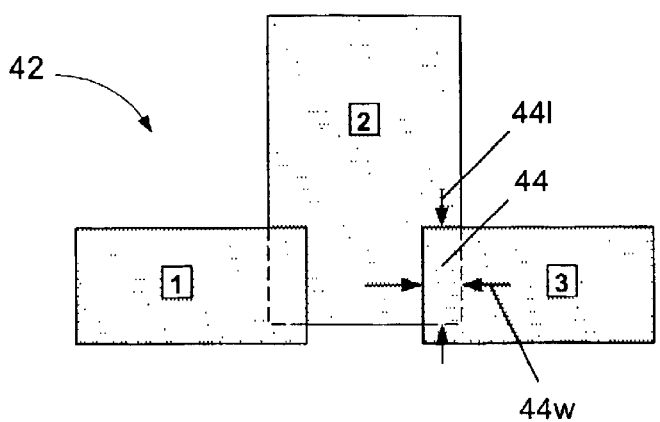
FIG. 6 is an enlarged view of an illustrative feature in the pattern depicted in FIG. 5.

FIG. 6 is an enlarged view of an illustrative feature 42 depicting an illustrative overlap regions 44 allowed by the present invention. The size of the overlap regions 44 may vary depending upon a variety of factors, such as the pattern being written, the location of the overlap regions 44, the precision in forming the corresponding feature in the integrated circuit device, etc. In the overlap regions 44, the layer of photoresist 26 will be subjected to an exposure process twice. Nevertheless, the present invention may be very useful in many situations to reduce the overall reticle writing time.

Figure 7A:
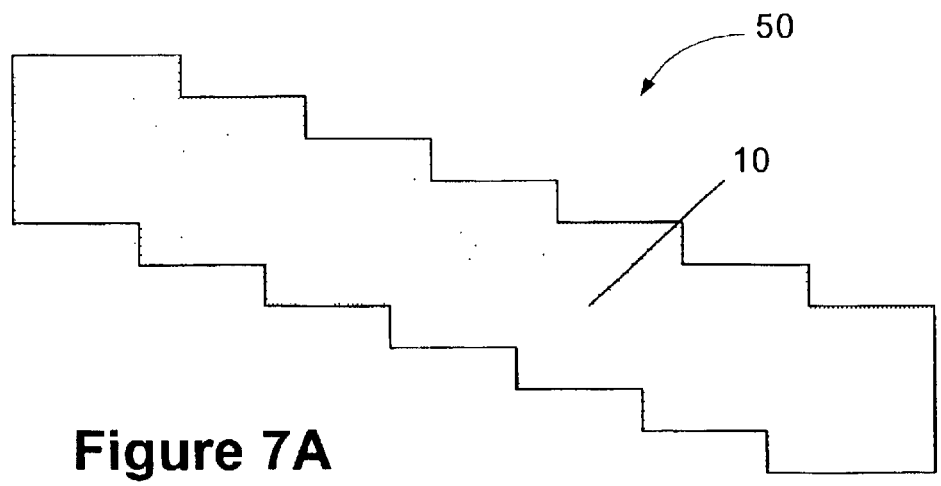
FIGS. 7A–7C are comparison views of an illustrative reticle writing pattern (FIG. 7A) fragmented in accordance with prior art techniques (FIG. 7B) and the present invention (FIG. 7C)
Figure 7B:
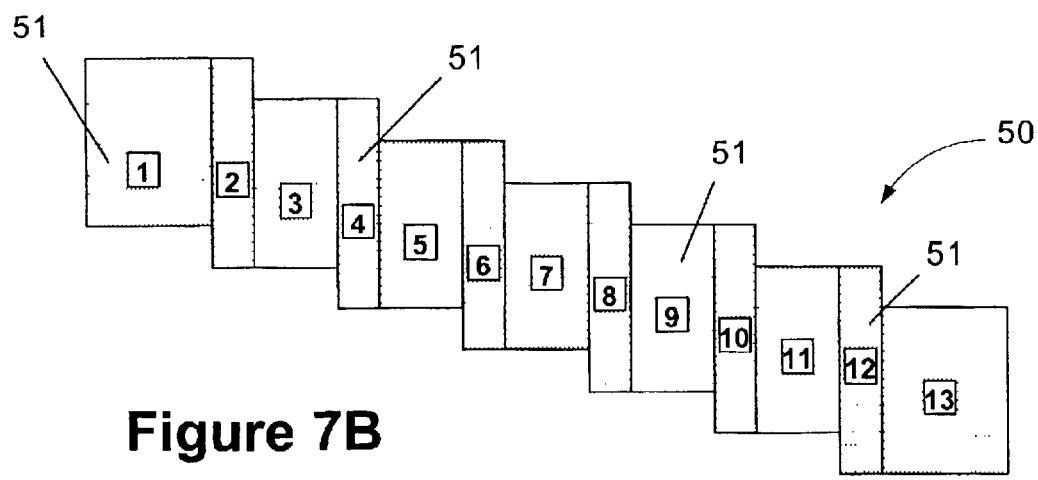
Figure 7C:
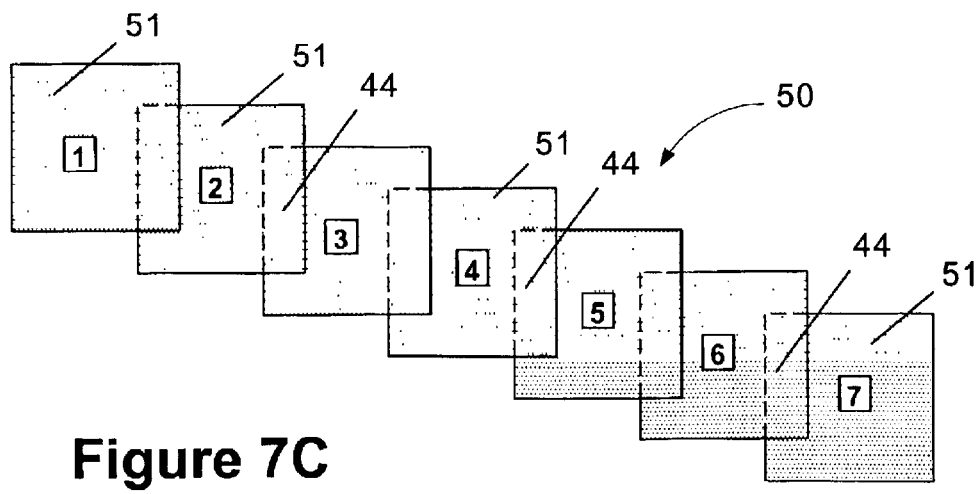

FIGS. 7A–7C are plan views depicting a reticle writing plan for a more complex reticle pattern. More specifically, FIG. 7A is a plan view of a portion of a pattern 50 to be created on a reticle (not shown). FIG. 7B is a depiction of a reticle writing strategy according to one illustrative prior art technique, whereas FIG. 7C is a depiction of a reticle writing plan in accordance with one embodiment of the present invention. As shown in FIG. 7B, a prior art reticle writing methodology would involve fracturing the desired pattern 50 into 13 fragmented fields 51 in which each of the fields 1–13 do not overlap with one another. In contrast, FIG. 7C is a plan view depicting a reticle writing plan in which overlap of the fractured fields 51 is allowed. As shown therein, the number of fragmented fields 51 is reduced to seven when practicing the reticle writing methodology of the present invention. That is, all other things being equal, the reticle writing time may be reduced by over 50% by using the present invention. Again, the size and extent of the overlap regions 44 may vary with each application.

Traditionally, a semiconductor manufacturer will provide a reticle manufacturer with digital information that reflects the overall desired reticle pattern. The reticle manufacturer may then fragment the digital data for the overall reticle pattern to produce a writing plan for writing the desired pattern on the reticle. In accordance with one illustrative embodiment of the present invention, the reticle pattern information is provided to the reticle manufacturer as separate data packages. That is, for example, with reference to FIG. 5, the reticle manufacturer may be provided with a first set of data that corresponds to the sections labeled "2" in FIG. 5, and a second set of data that corresponds to the sections labeled "1" and "3." Upon receipt of this information, the controller 34 for the reticle exposure tool 30 may perform a first reticle writing process in which all of the number "2" sections are exposed in the layer of photoresist 26. Thereafter, the controller 34 may perform a second reticle writing process in which all of the regions "1" and "3" are exposed. Thus, by providing the data that corresponds to areas to be exposed in at least two separate data fields, the reticle exposure tool 30 may perform its exposure processes without regard for any overlap regions 44 in the combined fields.

Similarly, the digital data for the overall reticle pattern shown in FIG. 7A may be provided as two sets of data. The first set of data for the desired reticle pattern may include data for all of the odd number fields 1, 3, 5, 7, etc. Upon receipt of this first set of data, the controller 34 may direct a writing process in which only these fields are exposed. Thereafter, a second set of data is provided to the controller 34 for the even numbered fields, e.g., 2, 4, 6, etc. The controller 34 may then direct a writing operation wherein only the even numbered fields are subjected to the exposure process. This second writing operation is performed independent of the first writing process using the first set of data.

Using the present methodology, the data for the overall reticle pattern may be provided to the reticle exposure tool 30 in such a manner that the location and size of the overlap regions 44 in the pattern may be controlled. Moreover, the data for the overall reticle pattern may be divided into more than two data packages depending upon the particular application and the complexity of the reticle pattern. For example, the digital data corresponding to the overall reticle pattern may be separated into three separate groups, and first, second and third writing patterns may be performed to create a reticle. Thereafter, multiple reticle writing processes may be performed in accordance with the present invention wherein overlap regions 44 are allowed in the reticle writing processes. Lastly, the present invention may be employed in combination with prior art reticle writing strategies. For example, only selected portions of an overall reticle pattern may be written in accordance with the techniques described herein.

The reticle writing strategies disclosed herein are essentially independent of the process bias normally taken into account when the writing pattern for a reticle is determined. That is, since the present invention allows for the overlap of portions of the areas exposed during the multiple writing processes, process bias becomes less important in designing the reticle writing strategy. Simply put, the overlap regions 44 allowed by the present invention can be used to compensate for changes in process bias.

Figure 8:
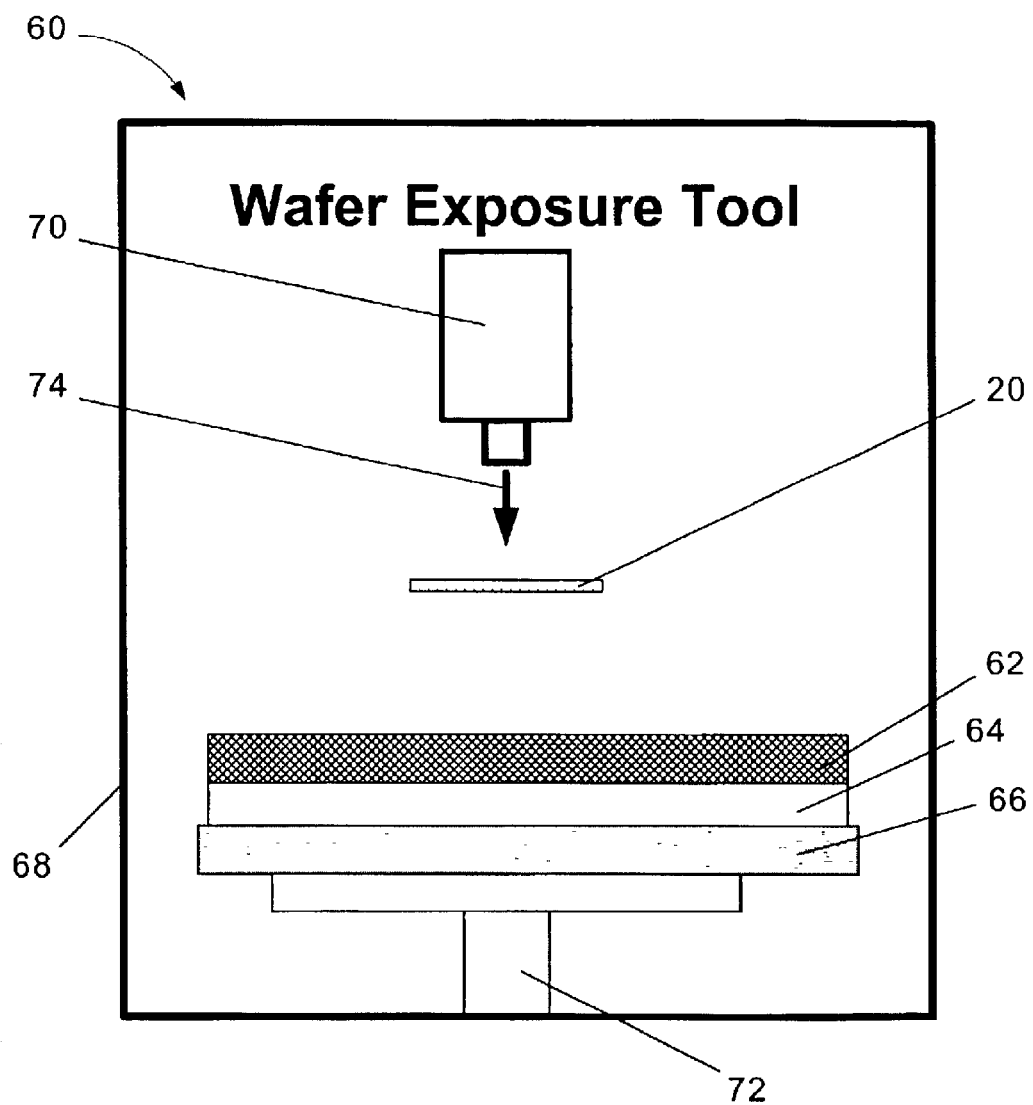
FIG. 8 is a schematic depiction of an illustrative wafer exposure tool that may use a reticle of the present invention to expose a process layer formed above a semiconducting substrate.

FIG. 8 is a schematic depiction of a system that may be employed in accordance with one illustrative embodiment of the present invention. As shown therein, a wafer exposure tool 60 uses a reticle 20, the pattern of which was written in accordance with the techniques disclosed herein, to expose selected portions of a layer of photoresist 62 formed above a process layer 64 that is formed above a semiconducting substrate 66. In general, the wafer exposure tool 60 is comprised of a housing 68, a light source 70 and a wafer stage 72. Radiant energy, typically ultraviolet light, as illustratively indicated by the arrow 74, is directed through the reticle 20 and projected onto a portion of the layer of photoresist 62. The wafer exposure tool 60 also includes a relatively complex collection of optical lenses and associated equipment to perform this task, although such equipment is not depicted in FIG. 8 so as not to obscure the present invention. The exposure tool 40 may be any type of exposure tool commonly found in semiconductor manufacturing operations. Typically, the exposure tool 40 is a so-called stepper in which portions of the layer of photoresist 62 are exposed on a flash-by-flash basis as the wafer is stepped, or moved, incrementally after each flash. This process is continued until such time as all desired regions of the layer of photoresist has been exposed. The layer of photoresist 62 may be either a positive or negative photoresist material. Moreover, the process layer 64 may be comprised of a variety of materials, e.g., a metal, an insulating layer, polysilicon, etc.

In one aspect, the present invention is generally directed to various reticle writing methodologies to reduce write time, and a system for performing same. In one illustrative embodiment, the method comprises exposing a layer of photoresist in accordance with a first writing pattern in a first area of the layer of photoresist and exposing the layer of photoresist in accordance with a second writing pattern in a second area of the layer of photoresist, the first and second areas of the layer of photoresist overlapping one another in at least one region. In further embodiments, the method further comprises creating the first and second writing patterns by separating digital data corresponding to a desired pattern for a reticle into at least two separate groups of data, a first of the data groups being used to define the first writing pattern and a second of the data groups being used to define the second writing pattern.

In another illustrative embodiment, the method comprises creating a collection of digital data corresponding to a desired pattern for a reticle and separating the collection of digital data into at least two separate groups of data, a first of the data groups being used to define a first writing pattern for the reticle, a second of the data groups being used to define a second writing pattern for the reticle, wherein the first and second writing patterns overlap one another in at least one region. In further embodiments, the method may further comprise separating the collection of digital data into at least three separate groups of data, a third of the data groups being used to define a third writing pattern for the reticle, wherein the third reticle writing pattern overlaps at least one of the first and second writing patterns in at least one region.

The present invention may also be employed in the context of forming features for an integrated circuit device. That is, the writing methodologies disclosed herein may be applied to expose a layer of photoresist (positive or negative) that is used in forming features on production integrated circuit devices. Such features may include, but should not be considered as limited to, the formation of features such as gate electrode structures, trenches in a layer of insulating material, shallow trench isolation structures, etc. For example, the techniques described herein may be employed to expose a layer of photoresist formed above a layer of polysilicon. Thereafter, the layer of photoresist may be developed using traditional photoresist development processes. One or more etching processes may then be performed while using the patterned layer of photoresist as a mask to define a plurality of features, e.g., gate electrode structures, in the layer of polysilicon.

In this embodiment of the invention, the desired pattern to be formed in the layer of photoresist may be determined based upon the particular product or feature under construction. The desired pattern for the layer of photoresist may typically be represented by a collection of digital information. Thereafter, this collection of digital data may, in one embodiment, be separated into separate data packages in a similar manner to that described previously with respect to the use of the present invention in forming a reticle. In short, the digital information corresponding to the desired pattern to be formed in the layer of photoresist may be separated into at least two separate data fields. In this embodiment of the present invention, electrons from an electron beam source, such as the source 36 depicted in the exposure tool 30 shown in FIG. 4, may be used to expose the desired portions of the layer of photoresist. The writing pattern for the electron beam source 36 to expose the layer of photoresist may be provided to an exposure tool in a manner similar to that described above with respect to the writing pattern for the reticle. That is, the writing pattern for the layer of photoresist may be separated into at least a first set of data and a second set of data, each of which correspond to desired areas of exposure of the layer of photoresist. Thereafter, the layer of photoresist may be exposed by performing multiple writing or exposure processes in the manner described above with respect to the writing strategies employed in forming the reticle.

A variety of methods are disclosed herein wherein the present invention may be employed to expose a layer of photoresist in the context of manufacturing production integrated circuit devices. In one illustrative embodiment, the method comprises forming a layer of photoresist above at least one of a semiconducting substrate and a process layer, exposing the layer of photoresist in accordance with a first writing pattern in a first area of the layer of photoresist, and exposing the layer of photoresist in accordance with a second writing pattern in a second area of the layer of photoresist, the first and second areas overlapping one another in at least one region. The substrate may be comprised of a variety of semiconducting materials, e.g., silicon, germanium, etc. The process layer may be comprised of any material employed in manufacturing integrated circuit products, e.g., a layer of insulating material, a layer comprised of a metal, polysilicon, etc. After the layer of photoresist is exposed in accordance with the present techniques, it may be developed using a variety of known development techniques and processes. Thereafter, the patterned layer of photoresist may be used as a mask layer in one or more subsequent etching processes.

In another illustrative embodiment, the method comprises forming a layer of photoresist above at least one of a semiconducting substrate and a process layer, creating a collection of digital data corresponding to a desired pattern for the layer of photoresist, and separating the collection of digital data into at least two separate groups of data, a first of the data groups being used to define a first writing pattern for the layer of photoresist, a second of the data groups being used to define a second writing pattern for the layer of photoresist, wherein the first and second writing patterns overlap one another in at least one region.

In yet another illustrative embodiment, there is provided an exposure system that comprises an electron beam source and a controller that is adapted to direct electrons emitted by the electron beam source so as to expose a layer of photoresist in accordance with a first writing pattern in a first area of a layer of photoresist and expose the layer of photoresist in accordance with a second writing pattern in a second area of the layer of photoresist, the first and second areas of the layer of photoresist overlapping one another in at least one region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   exposing a layer of photoresist in accordance with a first writing pattern in a first area of said layer of photoresist; and
   exposing said layer of photoresist in accordance with a second writing pattern in a second area of said layer of photoresist, said first and second areas overlapping one another in at least one region, wherein said first and second writing patterns are created by separating digital data corresponding to a desired pattern for a reticle into at least two separate groups of data, a first of said data groups being used to define said first writing pattern and a second of said data groups being used to define said second writing pattern.

2. The method of claim 1, further comprising removing portions of the layer of photoresist.

3. The method of claim 1, further comprising removing exposed portions of said layer of photoresist in said first and second areas.

4. The method of claim 2, further comprising performing an etching process to define a pattern in an opaque layer positioned under said layer of photoresist.

5. The method of claim 4, wherein said opaque layer is comprised of a metal or a metal alloy.

6. The method of claim 4, wherein said opaque layer is comprised of chromium.

7. The method of claim 1, wherein said layer of photoresist is comprised of at least one of a positive photoresist material and a negative photoresist material.

8. The method of claim 1, further comprising exposing said layer of photoresist in accordance with a third writing pattern in a third area of said layer of photoresist.

9. The method of claim 8, wherein said third area of said layer of photoresist overlaps at least one of said first and second areas in at least one area.

10. The method of claim 4, further comprising exposing a portion of a layer of photoresist formed above a process layer by directing radiant energy through said reticle.

11. The method of claim 1, wherein said layer of photoresist is formed above an opaque layer of a reticle.

12. The method of claim 1, wherein said layer of photoresist is formed above at least one of a semiconducting substrate and a process layer.

13. A method of forming a reticle, comprising:
    forming a layer of photoresist above an opaque layer;
    exposing said layer of photoresist in accordance with a first writing pattern in a first area of said layer of photoresist; and
    exposing said layer of photoresist in accordance with a second writing pattern in a second area of said layer of photoresist, said first and second areas overlapping one another in at least one region, wherein said first and second writing patterns are created by separating digital data corresponding to a desired pattern for said reticle into at least two separate groups of data, a first of said data groups being used to define said first writing pattern and a second of said data groups being used to define said second writing pattern.

14. The method of claim 13, further comprising removing portions of the layer of photoresist.

15. The method of claim 13, further comprising removing exposed portions of said layer of photoresist in said first and second areas.

16. The method of claim 14, further comprising performing an etching process to define a pattern in said opaque layer.

17. The method of claim 13, wherein said opaque layer is comprised of a metal or a metal alloy.

18. The method of claim 13, wherein said opaque layer is comprised of chromium.

19. The method of claim 13, wherein said layer of photoresist is comprised of at least one of a positive photoresist material and a negative photoresist material.

20. The method of claim 13, further comprising exposing said layer of photoresist in accordance with a third writing pattern in a third area of said layer of photoresist.

21. The method of claim 20, wherein said third area of said layer of photoresist overlaps at least one of said first and second areas in at least one area.

22. The method of claim 16, further comprising exposing a portion of a layer of photoresist formed above a process layer by directing radiant energy through said reticle.

23. A method of forming a reticle, comprising:

forming a layer of photoresist above an opaque layer;

exposing said layer of photoresist in accordance with a first writing pattern in a first area of said layer of photoresist;

exposing said layer of photoresist in accordance with a second writing pattern in a second area of said layer of photoresist, said first and second areas of said layer of photoresist overlapping one another in at least one area, wherein said first and second writing Patterns are created by separating digital data corresponding to a desired pattern for said reticle into at least two separate groups of data, a first of said data groups being used to define said first writing pattern and a second of said data groups being used to define said second writing pattern; and removing exposed portions of the layer of photoresist in said first and second areas.

24. The method of claim 23, further comprising performing an etching process to define a pattern in said opaque layer.

25. The method of claim 23, wherein said opaque layer is comprised of a metal or a metal alloy.

26. The method of claim 23, wherein said opaque layer is comprised of chromium.

27. The method of claim 23, wherein said layer of photoresist is comprised of a positive photoresist material.

28. The method of claim 23, further comprising exposing said layer of photoresist in accordance with a third writing pattern in a third area of said layer of photoresist.

29. The method of claim 28, wherein said third area of said layer of photoresist overlaps at least one of said first and second areas in at least one region.

30. The method of claim 24, further comprising exposing a portion of a layer of photoresist formed above a process layer by directing radiant energy through said reticle.

31. A method of forming a reticle, comprising:

creating a collection of digital data corresponding to a desired pattern for said reticle; and separating said collection of digital data into at least two separate groups of data, a first of said data groups being used to define a first writing pattern for said reticle, a second of said data groups being used to define a second writing pattern for said reticle, wherein said first and second writing patterns overlap one another in at least one region.

32. The method of claim 31, further comprising performing said first and second writing patterns on a layer of photoresist positioned above an opaque layer.

33. The method of claim 32, further comprising removing portions of the layer of photoresist.

34. The method of claim 33, further comprising performing an etching process to define a pattern in an opaque layer positioned under said layer of photoresist.

35. The method of claim 34, wherein said opaque layer is comprised of a metal or a metal alloy.

36. The method of claim 34, wherein said opaque layer is comprised of chromium.

37. The method of claim 32, wherein said layer of photoresist is comprised of at least one of a positive photoresist material and a negative photoresist material.

38. The method of claim 31, wherein said collection of digital data is separated into at least three separate groups of data, a third of said data groups being used to define a third writing pattern for said reticle, wherein said third reticle writing pattern overlaps at least one of said first and second writing patterns in at least one region.

39. The method of claim 34, further comprising exposing a portion of a layer of photoresist formed above a process layer by directing radiant energy through said reticle.

40. A method, comprising:

providing a semiconducting substrate having a process layer formed thereabove and a first layer of photoresist formed above said process layer; and exposing at least a portion of said first layer of photoresist by directing radiant energy through a reticle, said reticle being formed by:

exposing a second layer of photoresist formed above an opaque layer in accordance with a first writing pattern in a first area of said second layer of photoresist;

exposing said second layer of photoresist in accordance with a second writing pattern in a second area of said second layer of photoresist, said first and second areas of said second layer of photoresist overlapping one another in at least one region, wherein said first and second writing patterns are created by separating digital data corresponding to a desired pattern for said reticle into at least two separate groups of data, a first of said data groups being used to define said first writing pattern and a second of said data groups being used to define said second writing pattern; and removing portions of the second layer of photoresist in said first and second areas; and performing an etching process to define a pattern in said opaque layer.

41. The method of claim 40, wherein said opaque layer is comprised of a metal or a metal alloy.

42. The method of claim 40, wherein said opaque layer is comprised of chromium.

43. The method of claim 40, wherein said first layer of photoresist is comprised of a positive photoresist material.

44. The method of claim 40, wherein said second layer of photoresist is comprised of a positive photoresist material.

45. A method, comprising:

forming a layer of photoresist above at least one of a semiconducting substrate and a process layer;

exposing said layer of photoresist in accordance with a first writing pattern in a first area of said layer of photoresist; and exposing said layer of photoresist in accordance with a second writing pattern in a second area of said layer of photoresist, said first and second areas overlapping one another in at least one region, wherein said first and second writing patterns are created by separating digital data corresponding to a desired pattern for said layer of photoresist into at least two separate groups of data, a first of said data groups being used to define said first writing pattern and a second of said data groups being used to define said second writing pattern.

46. The method of claim 45, wherein said process layer is comprised of at least one of an insulating material, a layer of metal and a layer of polysilicon.

47. The method of claim 45, further comprising removing portions of the layer of photoresist.

48. The method of claim 45, further comprising removing exposed portions of said layer of photoresist in said first and second areas.

49. The method of claim 46, further comprising performing an etching process to define a pattern in at least one of said substrate and said process layer.

50. The method of claim 45, wherein said layer of photoresist is comprised of at least one of a positive photoresist material and a negative photoresist material.

51. The method of claim 45, further comprising exposing said layer of photoresist in accordance with a third writing pattern in a third area of said layer of photoresist.

52. The method of claim 51, wherein said third area of said layer of photoresist overlaps at least one of said first and second areas in at least one area.

53. A method, comprising:
forming a layer of photoresist above at least one of a semiconducting substrate and a process layer;
exposing said layer of photoresist in accordance with a first writing pattern in a first area of said layer of photoresist;
exposing said layer of photoresist in accordance with a second writing pattern in a second area of said layer of photoresist, said first and second areas of said layer of photoresist overlapping one another in at least one area, wherein said first and second writing patterns are created by separating digital data corresponding to a desired pattern for said layer of photoresist into at least two separate groups of data, a first of said data groups being used to define said first writing pattern and a second of said data groups being used to define said second writing pattern; and
removing exposed portions of the layer of photoresist in said first and second areas.

54. The method of claim 53, further comprising performing an etching process to define a pattern in at least one of said substrate and said process layer.

55. The method of claim 53, wherein said process layer is comprised of at least one of an insulating material, a layer of metal and a layer of polysilicon.

56. The method of claim 53, wherein said layer of photoresist is comprised of a positive photoresist material.

57. The method of claim 53, further comprising exposing said layer of photoresist in accordance with a third writing pattern in a third area of said layer of photoresist.

58. The method of claim 57, wherein said third area of said layer of photoresist overlaps at least one of said first and second areas in at least one region.

59. A method, comprising:
forming a layer of photoresist above at least one of a semiconducting substrate and a process layer;
creating a collection of digital data corresponding to a desired pattern for said layer of photoresist; and
separating said collection of digital data into at least two separate groups of data, a first of said data groups being used to define a first writing pattern for said layer of photoresist, a second of said data groups being used to define a second writing pattern for said layer of photoresist, wherein said first and second writing patterns overlap one another in at least one region.

60. The method of claim 59, further comprising performing said first and second writing patterns on at least one of said substrate and said process layer.

61. The method of claim 60, further comprising removing portions of the layer of photoresist.

62. The method of claim 61, further comprising performing an etching process to define a pattern in at least one of said substrate and said process layer.

63. The method of claim 59, wherein said process layer is comprised of at least one of an insulating material, a layer of metal and a layer of polysilicon.

64. The method of claim 60, wherein said layer of photoresist is comprised of at least one of a positive photoresist material and a negative photoresist material.

65. The method of claim 59, wherein said collection of digital data is separated into at least three separate groups of data, a third of said data groups being used to define a third writing pattern for said layer of photoresist, wherein said third reticle writing pattern overlaps at least one of said first and second writing patterns in at least one region.

66. An exposure system, comprising:
an electron beam source; and
a controller that is adapted to direct electrons emitted by said electron beam source so as to:
expose a layer of photoresist in accordance with a first writing pattern in a first area of a layer of photoresist, and
expose said layer of photoresist in accordance with a second writing pattern in a second area of said layer of photoresist, said first and second areas of said layer of photoresist overlapping one another in at least one region, wherein said controller is adapted to perform said first and second writing patterns by processing separate groups of digital data corresponding to a desired pattern, a first of said data groups being used to define said first writing pattern and a second of said data groups being used to define said second writing pattern.

67. The system of claim 66, wherein said layer of photoresist is formed above at least one of a semiconducting substrate and a process layer.

68. The system of claim 66, wherein said layer of photoresist is formed above an opaque layer of a reticle.

69. The system of claim 68, wherein said opaque layer is comprised of a metal or a metal alloy.

70. The system of claim 68, wherein said opaque layer is comprised of chromium.

71. The system of claim 66, wherein said layer of photoresist is comprised of at least one of a positive photoresist material and a negative photoresist material.

72. The system of claim 66, wherein said controller is further adapted to expose said layer of photoresist in accordance with a third writing pattern in a third area of said layer of photoresist.

73. The system of claim 72, wherein said third area of said layer of photoresist overlaps at least one of said first and second areas in at least one region.

74. A reticle writing system, comprising:
an electron beam source; and
a controller that is adapted to direct electrons emitted by said electron beam source so as to:
expose a layer of photoresist in accordance with a first writing pattern in a first area of a layer of photoresist formed above an opaque layer of a reticle, and
expose said layer of photoresist in accordance with a second writing pattern in a second area of said layer of photoresist, said first and second areas of said layer of photoresist overlapping one another in at least one region, wherein said controller is adapted to perform said first and second writing patterns by processing separate groups of digital data corresponding to a desired pattern for said reticle, a first of said data groups being used to define said first writing pattern and a second of said data groups being used to define said second writing pattern.

75. The system of claim 74, wherein said exposure of said layer of photoresist is performed at an energy level of approximately 50 keV.

76. The system of claim 74, wherein said opaque layer is comprised of a metal or a metal alloy.

77. The system of claim 74, wherein said opaque layer is comprised of chromium.

78. The system of claim 74, wherein said layer of photoresist is comprised of at least one of a positive photoresist material and a negative photoresist material.

79. The system of claim 74, wherein said controller is further adapted to expose said layer of photoresist in accordance with a third writing pattern in a third area of said layer of photoresist.

80. The system of claim 79, wherein said third area of said layer of photoresist overlaps at least one of said first and second areas in at least one region.

81. An exposure system, comprising:
an electron beam source; and
a controller that is adapted to direct electrons emitted by said electron beam source so as to:
expose a layer of photoresist in accordance with a first writing pattern in a first area of a layer of photoresist formed above at least one of a semiconducting substrate and a process layer, and
expose said layer of photoresist in accordance with a second writing pattern in a second area of said layer of photoresist, said first and second areas of said layer of photoresist overlapping one another in at least one region, wherein said controller is adapted to perform said first and second writing patterns by processing separate groups of digital data corresponding to a desired pattern, a first of said data groups being used to define said first writing pattern and a second of said data groups being used to define said second writing pattern.

82. The system of claim 81, wherein said process layer is comprised of at least one of an insulating material, a layer of metal and a layer of polysilicon.

83. The system of claim 81, wherein said layer of photoresist is comprised of at least one of a positive photoresist material and a negative photoresist material.

84. The system of claim 81, wherein said controller is further adapted to expose said layer of photoresist in accordance with a third writing pattern in a third area of said layer of photoresist.

85. The system of claim 84, wherein said third area of said layer of photoresist overlaps at least one of said first and second areas in at least one region.

86. A wafer exposure system, comprising:
a light source;
a stage for receiving a semiconducting substrate having a process layer formed there-above and a first layer of photoresist formed above said process layer;
a reticle, said reticle being formed by:
exposing a second layer of photoresist formed above an opaque layer in accordance with a first writing pattern in a first area of said second layer of photoresist, and
exposing said second layer of photoresist in accordance with a second writing pattern in a second area of said second layer of photoresist, said first and second areas of said second layer of photoresist overlapping one another in at least one region, wherein said first and second writing patterns are created by separating digital data corresponding to a desired pattern for said reticle into at least two separate groups of data, a first of said data groups being used to define said first writing pattern and a second of said data groups being used to define said second writing pattern; and
a controller adapted to expose at least a portion of said first layer of photoresist by directing light from said light source through said reticle.

87. The system of claim 86, wherein said opaque layer is comprised of a metal or a metal alloy.

88. The system of claim 86, wherein said opaque layer is comprised of chromium.

89. The system of claim 86, wherein said first layer of photoresist is comprised of a positive photoresist material.

90. The system of claim 86, wherein said second layer of photoresist is comprised of a positive photoresist material.

* * * * *